United States Patent
Yang et al.

(10) Patent No.: US 7,989,829 B2
(45) Date of Patent: Aug. 2, 2011

(54) LIGHT EMITTING DIODE BACKLIGHT MODULE AND LIQUID CRYSTAL DISPLAY

(75) Inventors: Kun-Hsien Yang, Miao-Li (TW); Chien-Fan Tung, Miao-Li (TW)

(73) Assignee: Chimei Innolux Corporation, Miao-Li (TW)

( * ) Notice: Subject to any disclaimer, the term of this patent is extended or adjusted under 35 U.S.C. 154(b) by 872 days.

(21) Appl. No.: 11/645,456

(22) Filed: Dec. 26, 2006

(65) Prior Publication Data
US 2007/0146573 A1    Jun. 28, 2007

(30) Foreign Application Priority Data

Dec. 23, 2005 (TW) .............................. 94146365 A

(51) Int. Cl.
*H01L 33/00* (2010.01)
(52) U.S. Cl. .............. 257/98; 257/100; 257/E33.072; 349/65; 362/249.02; 362/97.3; 362/298
(58) Field of Classification Search .............. 257/98
See application file for complete search history.

(56) References Cited

U.S. PATENT DOCUMENTS

| | | | | |
|---|---|---|---|---|
| 4,529,907 A * | 7/1985 | Nagasawa | ...... | 313/499 |
| 4,638,343 A * | 1/1987 | Althaus et al. | ...... | 257/98 |
| 4,698,730 A * | 10/1987 | Sakai et al. | ...... | 362/311.05 |
| 5,122,943 A * | 6/1992 | Pugh | ...... | 362/256 |
| 6,236,514 B1 * | 5/2001 | Sato | ...... | 359/664 |
| 6,340,824 B1 * | 1/2002 | Komoto et al. | ...... | 257/99 |
| 6,356,700 B1 * | 3/2002 | Strobl | ...... | 385/147 |
| 6,469,755 B1 * | 10/2002 | Adachi et al. | ...... | 349/62 |
| 6,674,096 B2 * | 1/2004 | Sommers | ...... | 257/98 |
| 6,803,607 B1 * | 10/2004 | Chan et al. | ...... | 257/98 |
| 7,133,093 B2 | 11/2006 | Ochiai et al. | | |
| 2004/0032728 A1 | 2/2004 | Galli | | |
| 2005/0281050 A1 | 12/2005 | Chou | | |

* cited by examiner

*Primary Examiner* — Jerome Jackson, Jr.
(74) *Attorney, Agent, or Firm* — Wei Te Chung

(57) ABSTRACT

An exemplary light emitting diode (200) includes a base (18), a semiconductor chip (20), a cover (28), and two optical layers (30). The semiconductor chip is formed on the base. The cover is formed on the base and covers the semiconductor chip. The optical layers cover part of a peripheral side of the cover respectively.

20 Claims, 4 Drawing Sheets

LIGHT EMITTING DIODE BACKLIGHT MODULE AND LIQUID CRYSTAL DISPLAY

CROSS-REFERENCE TO RELATED APPLICATION

This application is related to, and claims the benefit of, a foreign priority application filed in Taiwan as Serial No. 94146365 on Dec. 23, 2005. The related application is incorporated herein by reference.

FIELD OF THE INVENTION

The present invention relates to backlight modules and liquid crystal displays, and more particularly to a light emitting diode (LED), a backlight module and a liquid crystal display using the light emitting diode, which is configured to provide scanning effect thereof.

GENERAL BACKGROUND

A typical liquid crystal display generally includes a display panel and a backlight module for illuminating the display panel. The backlight module can be classified into non-scanning and scanning backlight module. A non-scanning backlight module illuminates the display panel continuously while the display panel is turned on, but a scanning backlight module is switched on and off alternatively during a period of time while the display panel is turned on. The scanning backlight module includes a plurality of light emitting diodes (LEDs) arranged in a matrix array, which are switched on and off row by row so as to define a scanning effect for preventing the images between two frames of the display panel from image sticking.

Referring to FIG. 6, this shows a cross-sectional view of a backlight module 100 for a liquid crystal display. The backlight module 100 includes a reflective frame 2, a substrate 4, a plurality of red LEDs 8, a plurality of green LEDs 10, a plurality of blue LEDs 12, and a diffuser 14. The red, green, and blue LEDs 8, 10, 12 emit red, green and blue light beams respectively. The substrate 4 includes a plurality of partitions 6, and a plurality of slits 16 between the partitions 6. A cross section of each partition 6 is similar to a shape of a triangle.

The substrate 4 is located on the reflective frame 2, and the red, green, and blue LEDs 8, 10, and 12 penetrate through the slits 16. Light beams emitted from the LEDs 8, 10, and 12 are confined between two adjacent partitions 6. Each row of LEDs between two adjacent partitions 6 includes a plurality of the red, green, and blue LEDs 8, 10, and 12. Each of the partitions 6 and the substrate 4 is made from or coated with reflective material, such as silver. Therefore, the light beams emitted from the red, green, and blue LEDs 8, 10, and 12 can be reflected and concentrated between the adjacent partitions 6, and then almost all the light beams are reflected by the substrate 4 and the partitions 6 and enter the diffuser 14. The red, green, and blue LEDs 8, 10, and 12 in the same row are switched on or off together.

Along with the increasing size of the liquid crystal display, the size of the backlight module and the partitions used therein also increases. The partitions having larger size are liable to warp due to being pressed by the diffuser 14, thus, the quality of the liquid crystal display is decreased.

Accordingly, what is needed is an LED, a backlight module and a liquid crystal display configured to overcome the above-described problems.

SUMMARY

An exemplary light emitting diode includes a base, a semiconductor chip, a cover, and two optical layers. The semiconductor chip is formed on the base. The cover is formed on the base and covers the semiconductor chip. The optical layers cover part of a peripheral side of the cover respectively.

A detailed description of embodiments of the present invention is given below with reference to the accompanying drawings.

BRIEF DESCRIPTION OF THE DRAWINGS

In the drawings, all the views are schematic.

DETAILED DESCRIPTION OF PREFERRED EMBODIMENTS

Figure 1:
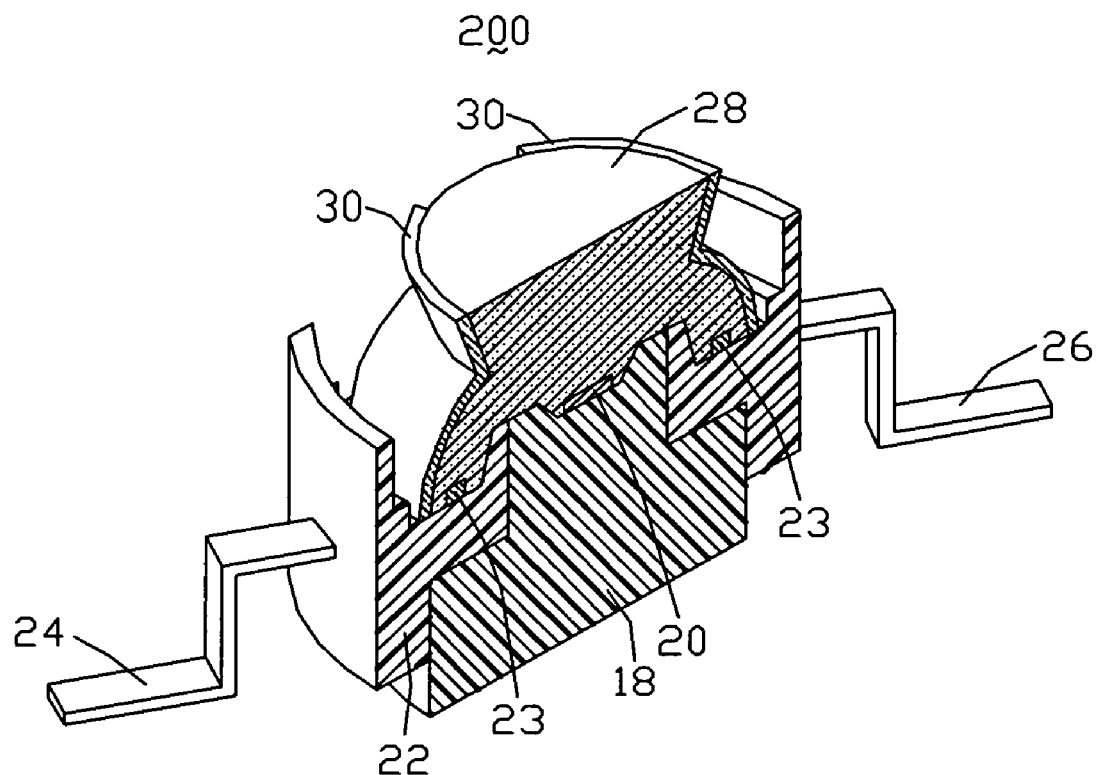
FIG. 1 is a cross-sectional view of a light emitting diode in accordance with a first embodiment of the present invention.

Referring to FIG. 1, this shows a cross-sectional view of a light emitting diode in accordance with a first embodiment of the present invention. The light emitting diode 200 includes a base 18, a semiconductor chip 20, a reflective frame 22, two connectors 23, a first pad 24, a second pad 26, a transparent cover 28, and two optical layers 30.

The semiconductor chip 20 is formed on an indentation part of top of the base 18. The reflective frame 22 is formed on the base 18 and covers a part thereof. The transparent cover 28 is formed on the base 18 and the reflective frame 22, and covers the semiconductor chip 20, and a part of the base 18 and reflective frame 22. The first and second pads 24, 26 are connected to the semiconductor chip 20 via the connectors 23 formed on the reflective frame 22 respectively.

The transparent cover 28 includes an upper part (not labeled) and a lower part (not labeled). The upper part and the lower part adjoin each other, and form a waist at the position where the upper part joins the lower part. The upper part has a top planar surface having a circular shape and a curved lateral surface. A bottom of the lower part covers the semiconductor chip 20 and a part of the base 18 and reflective frame 22. The lower part also has a curved lateral surface. The curved lateral surface of the lower part combining with the curved lateral surface of the upper surface forms a lateral surface of the transparent cover 28. A horizontal projective area of the waist is not only less than that of the upper part, but also less than that of the lower part.

A power supply (not shown) is connected to the light emitting diode 200 via the first and second pads 24, 26, and powers the semiconductor chip 20 through the connectors 23 to make the semiconductor chip 20 emit light beams. Light transmittance at the lateral surface of the transparent cover 28 is higher than light transmittance at the top planar surface thereof. Thus, a majority of light beams is irradiated out from the lateral surface of the transparent cover 28.

The two optical layers 30 are formed at two regions of the lateral surface of the transparent cover 28 respectively, thereby defining two intervals (not labeled) between the optical layers 30. The two intervals are opposite to each other. The light beams emitted from the semiconductor chip 20 can only be transmitted out from the transparent cover 28 through the two intervals.

Figure 2:
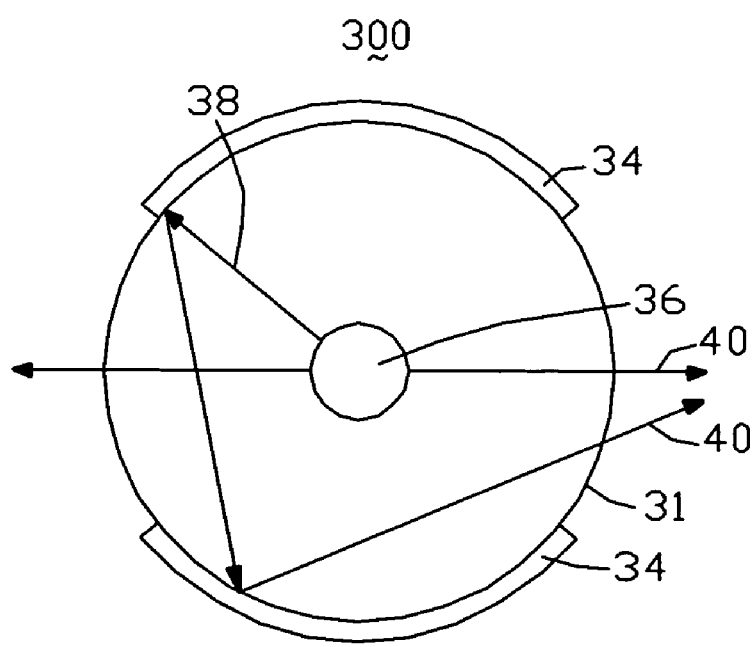
FIG. 2 is a top view of a light emitting diode with two reflection layers in accordance with a second embodiment of the present invention.

Referring to FIG. 2, this shows a schematic, top view of a light emitting diode 300 in accordance of a second embodiment of a backlight module of the present invention. The light emitting diode 300 includes a transparent cover 31, two reflection layers 34, and a light chip 36. The light chip 36 is covered by the transparent cover 31, and the reflection layers 34 are formed on two opposite peripheral sides of a lateral surface of the transparent cover 31 thereby defining two intervals (not labeled) between the reflection layers 34. The two intervals are opposite to each other. The reflection layers 34 are made from silver or aluminum, each of which has high light reflection ability.

The light chip 36 emits light beams outwardly, of which, the light beams 40 can be transmitted out generally in two directions through the intervals, and the light beams 38 are reflected by the reflection layer 34 back into the transparent cover 31. After being reflected several times by the reflection layer 34, the light beams 38 are emitted out from the transparent cover 31 through the intervals between the reflection layers 34 ultimately.

Figure 3:
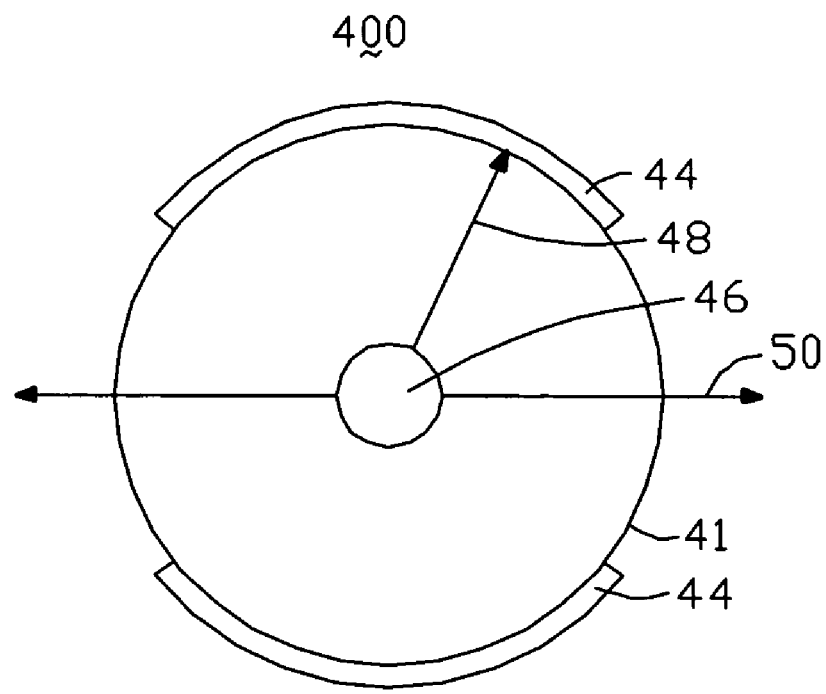
FIG. 3 is a top view of a light emitting diode with two absorption layers in accordance with a third embodiment of the present invention.

Referring to FIG. 3, this shows a schematic, top view of a light emitting diode 400 in accordance of a third embodiment of a backlight module of the present invention. The light emitting diode 400 includes a transparent cover 41, two absorption layers 44, and a light chip 46. The light chip 46 is covered by the transparent cover 41, and the absorption layers 44 are formed on two opposite peripheral sides of a lateral surface of the transparent cover 41, thereby defining two intervals (not labeled) between the absorption layers 44. The two intervals are opposite to each other. The absorption layers 44 are made from opaque resin which has light absorption ability.

The light chip 46 emits light beams outwardly, of which, the light beams 50 can be transmitted out generally in two directions through the intervals, and the light beams 48 are absorbed by the absorption layers 44. That is, the light beams 50 are emitted out from the transparent cover 41 through the intervals between the absorption layers 44.

Figure 4:
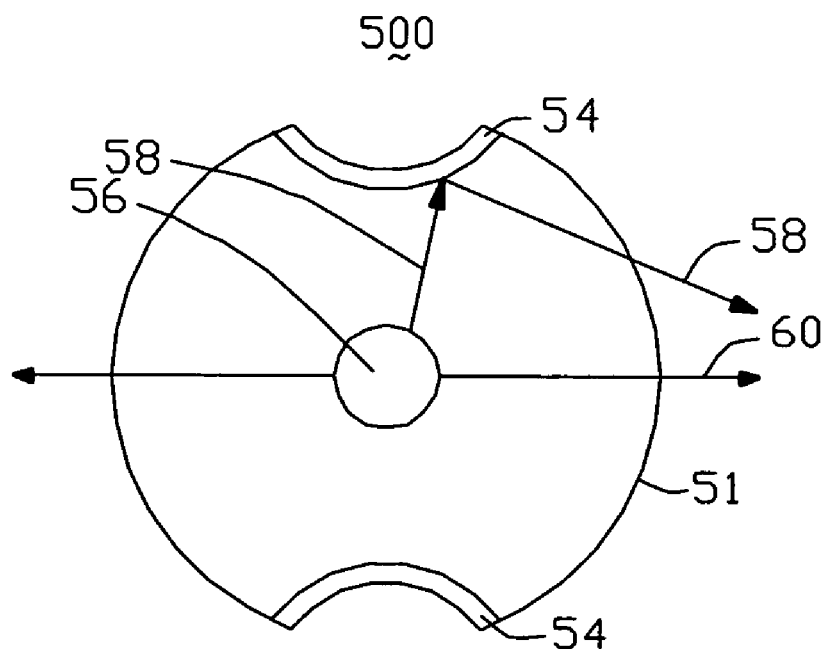
FIG. 4 is a top view of a light emitting diode with two reflection layers in accordance with a fourth embodiment of the present invention.

Referring to FIG. 4, this shows a schematic, top view of a light emitting diode 500 in accordance of a fourth embodiment of a backlight module of the present invention. The light emitting diode 500 includes a transparent cover 51 with two curve portions (not labeled) formed on opposite lateral sides thereof, two reflection layers 54, and a light chip 56. The light chip 56 is covered by the transparent cover 51, and the reflection layers 54 are formed on the two curve portions respectively, thereby defining two intervals (not labeled) between the reflection layers 54. The two intervals are opposite to each other. The reflection layers 54 are made from silver or aluminum, each of which has high light reflection ability.

The light chip 56 emits radial light beams outwardly, of which, the light beams 60 can be transmitted out generally in two directions through the intervals, and the light beams 58 transmitting toward the reflection layers 54 are reflected by the reflection layers 54 back into the transparent cover 51. After being reflected several times by the reflection layer 54, the light beams 58 are emitted out from the transparent cover 51 through the intervals between the reflection layers 54 ultimately.

Figure 5:
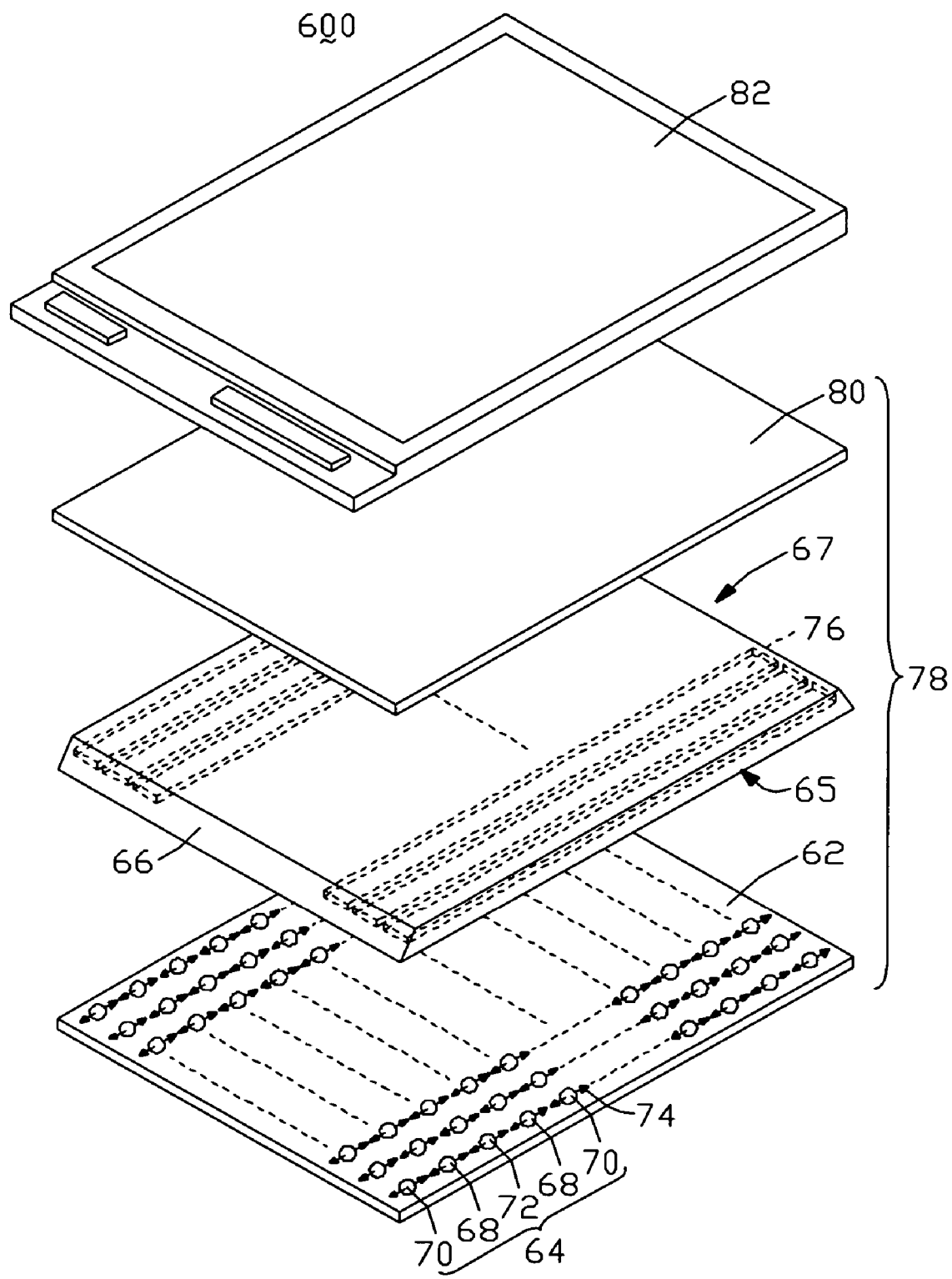
FIG. 5 is an exploded view of a liquid crystal display with a backlight module in accordance with a preferred embodiment of the present invention.
Figure 6:
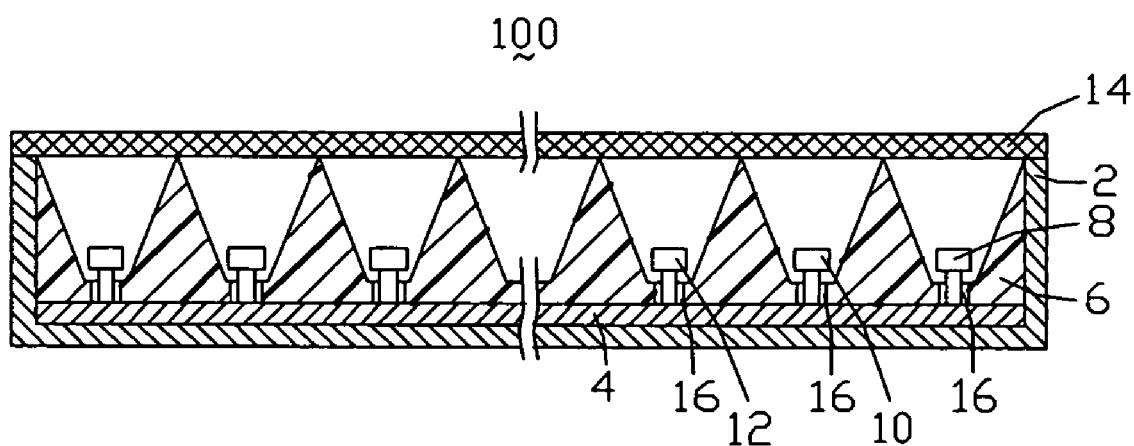
FIG. 6 is a cross-sectional view of a conventional backlight of a liquid crystal display.

Referring to FIG. 5, this shows an exploded view of a liquid crystal display 600 with a backlight module in accordance with a preferred embodiment of the present invention. The liquid crystal display 600 includes a liquid crystal panel 82, and a backlight module 78. The backlight module 78 includes a substrate 62, a reflective frame 67, and a diffuser 80. The reflective frame 67 is a metal frame coated with reflective material, such as, silver, which includes a base 65, and a plurality of sides 66. The base 65 includes a plurality of slits 76 arranged substantially parallel to each other. Each side 66 maintains a predetermined angle relative to the base 65.

A plurality of LED sets 64 are formed on the substrate 62 at positions according to the slits 76. Each LED set 64 includes two red LEDs 68, two green LEDs 70, and a blue LED 72 arranged adjacent to each other, and a sequence thereof is a green LED 70, a red LED 68, a blue LED 72, a red LED 68, and a green LED 70, as shown in FIG. 5. The sequence of the LEDs can also be a green LED 70, a red LED 68, the blue LED 72, a green LED 70, and a red LED 70. The red, green, and blue LEDs 68, 70, and 72 can be one type of the light emitting diodes 300, 400, 500 to emit light beams in a predetermined direction 74.

The reflective frame 67 is located on the substrate 62, and the LED sets 64 are accommodated in the corresponding slits 76. The diffuser 80 is arranged on the reflective frame 67, and the liquid crystal panel 82 is arranged on the backlight module 78.

The light beams emitted from the red, green, and blue LEDs 68, 70, and 72 are reflected by the reflective frame 67 and combined together as a white light beam, which then transmits toward the diffuser 80. The light beams are scattered uniformly by the diffuser 80, and then enter the liquid crystal panel 82 for displaying images.

In alternative embodiments, the material of the reflection layers 34, 54 is not limited to silver or aluminum, it can also be any kind of material that has light reflection ability. The material of the absorption layer 44 is not limited to opaque resin, but can be any kind of material that has light absorption ability.

The light emitting diodes 300, 400, and 500 arranged on the substrate in lines emit light beams only in desired directions, therefore, the light beams emitted from the light emitting diodes arranged in line do not interfere with other aligned light emitting diodes. Thus a step and cost to form the partitions can be saved.

While preferred and exemplary embodiments have been described above, it is to be understood that the invention is not limited thereto. To the contrary, the above description is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A light emitting diode package, comprising:
   a base;
   a semiconductor chip formed at the base for providing light beams;
   an encapsulating cover for sealing the semiconductor chip, the encapsulating cover comprising a lateral surface surrounding the semiconductor chip and a top surface above the semiconductor chip; and
   two optical layers being capable of blocking the light beams and covering two opposite parts of the lateral surface of the encapsulating cover respectively and exposing another two opposite parts of the lateral surface of the encapsulating cover to define two intervals between the two optical layers;
   wherein at least part of the light beams emitted by the semiconductor chip towards the lateral surface are transmitted out of the light emitting diode package through the intervals along at least two lateral directions.

2. The light emitting diode package as claimed in claim 1, wherein the encapsulating cover comprises two curve portions located in the lateral surface and arranged opposite to each other.

3. The light emitting diode package as claimed in claim 2, wherein the optical layers are formed at the curve portions.

4. A liquid crystal display, comprising:
   a backlight module comprising a plurality of light emitting diodes, each of the light emitting diodes having a semiconductor chip for emitting light beams, an encapsulating cover sealing the semiconductor chip, and two optical layers formed on the encapsulating cover, each of the optical layers configured for blocking light beams incident thereon; and
   a liquid crystal panel arranged at the backlight module;
   wherein the encapsulating cover comprises a lateral surface surrounding the semiconductor chip and a top surface above the semiconductor chip, the two optical layers cover two opposite parts of the lateral surface of the encapsulating cover respectively and exposing another two opposite parts of the lateral surface of the encapsulating cover to define two opposite intervals between the two optical layers, the intervals of each color emitting diode are arranged along a same line, and at least part of the light beams emitted by the semiconductor chip towards the lateral surface are transmitted out of the light emitting diode package through the intervals along at least two lateral directions.

5. The liquid crystal display as claimed in claim 4, wherein the encapsulating cover comprises two curve portions located in the lateral surface and arranged opposite to each other.

6. The liquid crystal display as claimed in claim 5, wherein the optical layers are formed at the curve portions.

7. The light emitting diode package as claimed in claim 1, wherein the encapsulating cover comprises an upper part, a lower part and a waist, the upper part and the lower part adjoin each other, the waist is located at a position where the upper part joins the lower part, and the lower part covers the semiconductor chip.

8. The light emitting diode package as claimed in claim 7, wherein the upper part and the lower part have curved lateral surfaces respectively, and the curved lateral surfaces cooperatively form the lateral surface of the encapsulating cover.

9. The light emitting diode package as claimed in claim 1, wherein the two optical layers are reflective layers.

10. The light emitting diode package as claimed in claim 1, wherein the two optical layers are light absorbing layers.

11. The liquid crystal display as claimed in claim 4, wherein the encapsulating cover comprises an upper part, a lower part and a waist, the upper part and the lower part adjoin each other, the waist is located at a position where the upper part joins the lower part, and the lower part covers the semiconductor chip.

12. The liquid crystal display as claimed in claim 11, wherein the upper part and the lower part have curved lateral surfaces respectively, and the curved lateral surfaces cooperatively form the lateral surface of the encapsulating cover.

13. The liquid crystal display as claimed in claim 11, wherein a horizontal projective area of the waist is less than a horizontal projective area of the upper part, and is less than a horizontal projective area of the lower part.

14. The liquid crystal display as claimed in claim 4, wherein the two optical layers are reflective layers.

15. The liquid crystal display as claimed in claim 4, wherein the two optical layers are light absorbing layers.

16. A light emitting diode string, comprising:
   a plurality of light emitting diodes arranged along a line, each light emitting diode comprising:
      a base;
      a semiconductor chip formed at the base for providing light beams;
      an encapsulating cover sealing the semiconductor chip, the encapsulating cover comprising a lateral surface surrounding the semiconductor chip and a top surface above the semiconductor chip; and
      two optical layers being capable of blocking the light beams and covering two opposite parts of the lateral surface of the encapsulating cover respectively and exposing another two opposite parts of the lateral surface of the encapsulating cover to define two intervals between the two optical layers;
   wherein the intervals of each light emitting diode are arranged along a same line, and at least part of the light beams emitted by the semiconductor chip towards the lateral surface are transmitted out of the light emitting diode package through the intervals along at least two lateral directions.

17. The light emitting diode string as claimed in claim 16, wherein the encapsulating cover of each light emitting diode comprises two curve portions located in the lateral surface and arranged opposite to each other, and the optical layers are formed at the curve portions.

18. The light emitting diode string as claimed in claim 17, wherein the encapsulating cover comprises an upper part, a lower part and a waist, the upper part and the lower part adjoin each other, the waist is located at a position where the upper part joins the lower part, the lower part covers the semiconductor chip, and the upper part and the lower part have curved lateral surfaces respectively, and the curved portions cooperatively form the lateral surface of the encapsulating cover.

19. The light emitting diode string as claimed in claim 16, wherein the two optical layers are reflective layers.

20. The light emitting diode string as claimed in claim 16, wherein the two optical layers are light absorbing layers.

* * * * *